United States Patent
Stockbridge

(10) Patent No.: US 6,301,108 B1
(45) Date of Patent: Oct. 9, 2001

(54) CHASSIS CONTAINING ELECTRONIC COMPONENTS WITH FIRE CONTAINMENT TRAP DOOR

(75) Inventor: Spence Stockbridge, Carol Stream, IL (US)

(73) Assignee: Westell, Inc., Aurora, IL (US)

( * ) Notice: Subject to any disclaimer, the term of this patent is extended or adjusted under 35 U.S.C. 154(b) by 0 days.

(21) Appl. No.: 09/472,727

(22) Filed: Dec. 27, 1999

(51) Int. Cl.$^7$ ........................................ H05K 7/20
(52) U.S. Cl. .................... 361/688; 361/695; 361/678; 454/184; 454/369; 174/16.1
(58) Field of Search .................. 361/683, 687, 361/688, 690–695, 723–726, 825; 165/80.3, 185, 104.32, 104.33, 104.34, 121, 80.2; 454/184, 357, 364, 369, 187, 342, 330–332; 236/49.5, 49.3; 62/259.2; 174/15.1, 16.1, 16.3, 17 VA, 52.2, 17 R

(56) References Cited

U.S. PATENT DOCUMENTS

| | | | |
|---|---|---|---|
| 3,818,816 | 6/1974 | Petit | 98/43 |
| 4,502,099 | 2/1985 | Manes et al. | 361/383 |
| 4,648,007 | 3/1987 | Garner | 361/384 |
| 4,763,711 | * 8/1988 | Hart et al. | 160/1 |
| 4,805,835 | 2/1989 | Schaus | 236/49 |
| 4,817,912 | * 4/1989 | McCabe | 251/11 |
| 4,881,981 | * 11/1989 | Thoma et al. | 148/11.5 R |
| 5,297,005 | 3/1994 | Gourdine | 361/697 |
| 5,422,787 | 6/1995 | Gourdine | 361/697 |
| 5,479,341 | * 12/1995 | Pihi et al. | 364/184 |
| 5,936,531 | * 8/1999 | Powers | 340/628 |
| 5,957,772 | * 9/1999 | Rutkowski et al. | 454/257 |
| 6,000,623 | * 12/1999 | Blatti et al. | 236/49.3 |
| 6,002,584 | * 12/1999 | Messmer et al. | 361/690 |
| 6,022,271 | * 2/2000 | Biondo | 454/369 |
| 6,135,875 | * 10/2000 | French | 454/184 |
| 6,155,921 | * 12/2000 | Evans et al. | 454/184 |

FOREIGN PATENT DOCUMENTS

411022698A * 1/1999 (JP) .................. F04D/29/54

* cited by examiner

Primary Examiner—Leo P. Picard
Assistant Examiner—Michael Datskovsky
(74) Attorney, Agent, or Firm—McDonnell Boehnen Hulbert & Berghoff

(57) ABSTRACT

A fire containment and air flow control mechanism for a device or chassis housing electronic components. The electronic components generate heat during operation of the device. An aperture in the housing permits warm air generated within the chassis to escape into the environment to cool the circuit board or card. A trap door is provided for the aperture for purposes of fire containment. Normally, the trap door is open, allowing the warm air to escape through the aperture. The trap door is moveable relative to the housing between a first position, in which the trap door does not cover the aperture, and a second position, in which the trap door substantially obstructs the aperture. A temperature sensitive material, such as a nylon or other polymeric filament that melts when subject to sufficient heat or flame, is operatively connected to the trap door. The temperature sensitive material is transformed, e.g., by melting, upon exposure to sufficient heat or flame within the device so as to cause the trap door to move to the second position relative to the aperture. In this position, the trap door substantially prevents migration of any flame present within the device through the aperture. For example, the trap door may be held away from the aperture by the filament, and when the filament melts the door swings by gravity or drops into a closed condition relative to the aperture.

14 Claims, 14 Drawing Sheets

COOL AIR IN

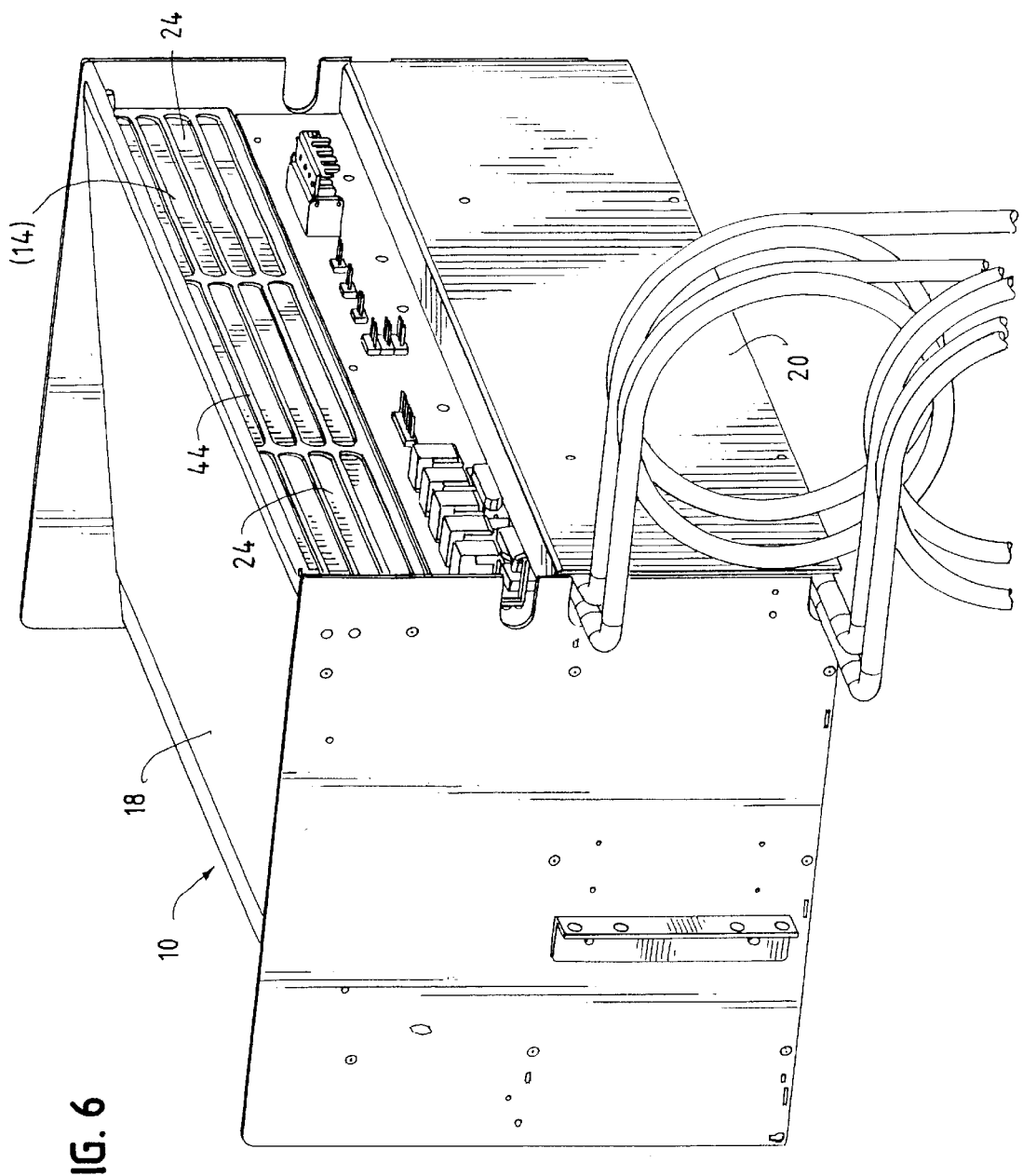

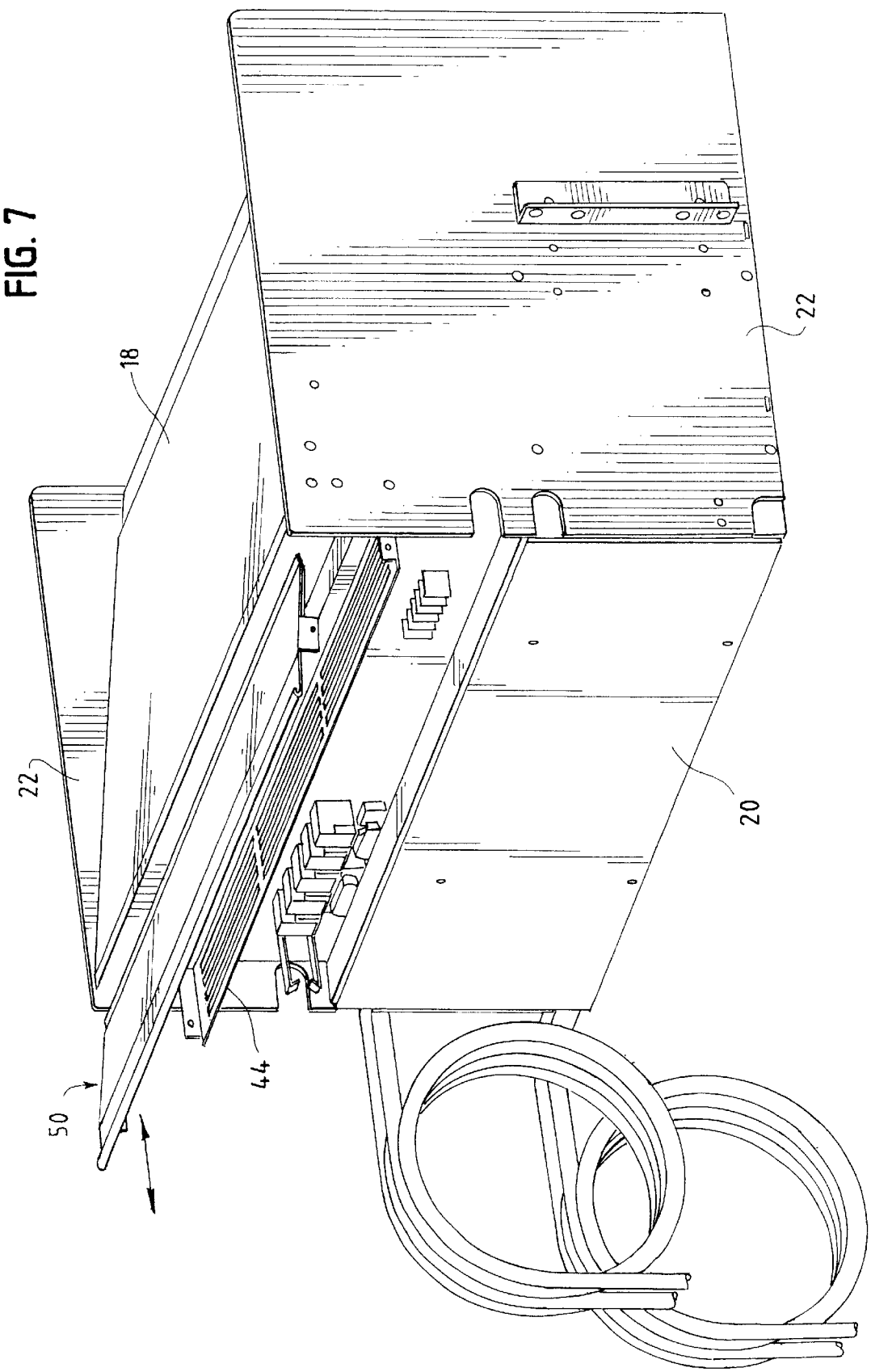

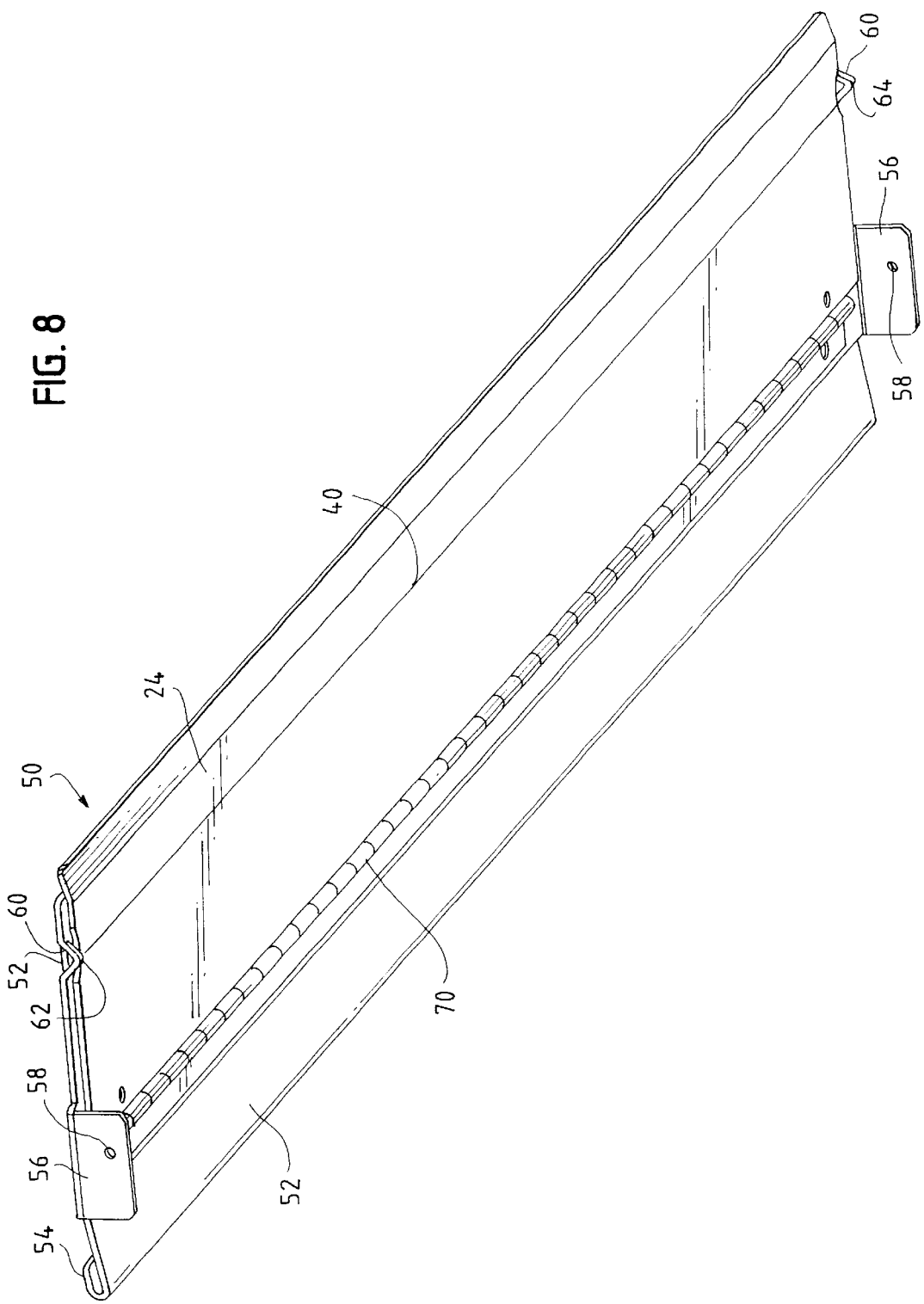

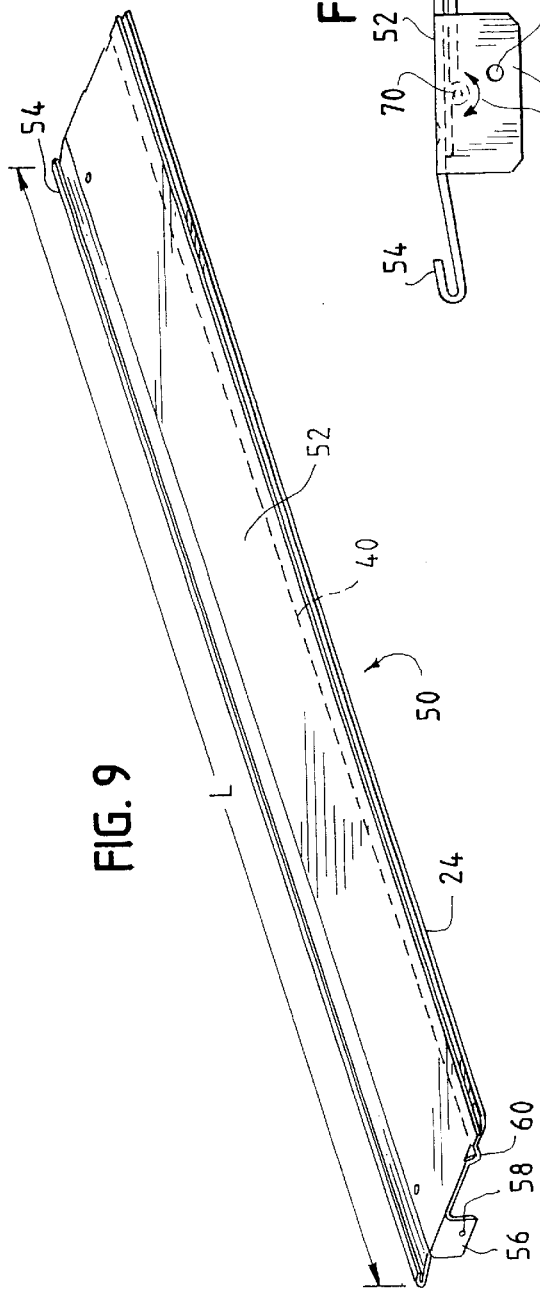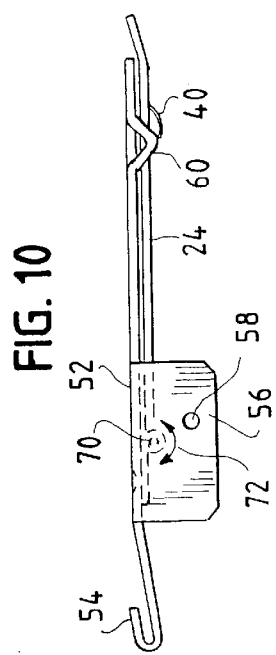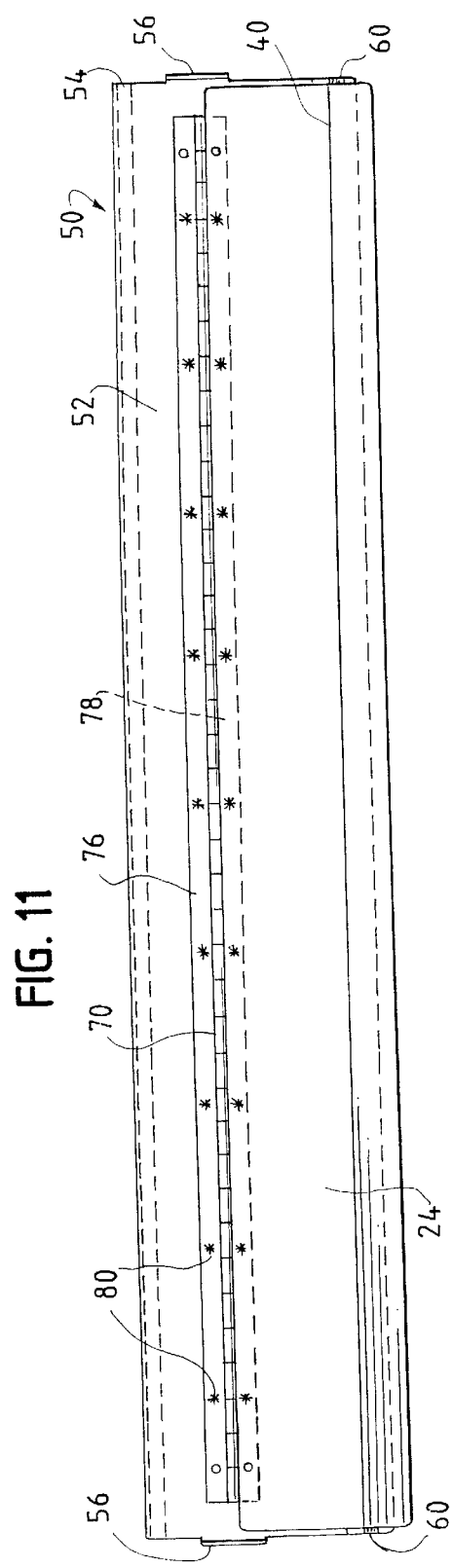

CHASSIS CONTAINING ELECTRONIC COMPONENTS WITH FIRE CONTAINMENT TRAP DOOR

BACKGROUND OF THE INVENTION

A. Field of the Invention

This invention relates to the mechanical aspects of a unitary device containing electronic components, referred to herein generically as a "chassis". Some examples are devices containing communications equipment and used by telephone companies, internet service providers, computer network operators, and other types of users. The features of the present invention contain any fire that may occur within the chassis and prevent flames from migrating out of the chassis into the enviromnent, while preserving airflow through the chassis to keep the chassis cool during periods of normal operation.

B. Description of Related Art

Integrated telecommunications devices, such as routers, switches, network access servers, remote access concentrators, TI span termination shelves, and other similar types of devices, often take the form of a large chassis or unit, sometimes weighing 50 to 100 lbs. or more. The chassis, sometimes referred to as a "shelf", typically incorporates one or more printed circuit boards or, more commonly, modular cards, with such cards typically being capable of being manually inserted and removed from the chassis. These printed circuit boards and/or cards incorporate semiconductor-based electronic components such as microprocessors and integrated circuit chips that generate significant amounts of heat during operation of the device.

Integrated circuit chips, microprocessors, and other similar electronic components are designed to operate within a particular temperature window. Accordingly, the heat generated by such components must be removed from the chassis or else the components will overheat and fail. It is known in the art to provide air flow features by which relatively cooler ambient air is conducted into the chassis, and relatively warmer air generated inside the chassis is exhausted from the chassis though an aperture in the chassis housing, typically using one or more fans. Representative patents addressing cooling and air flow considerations within an electronics device include the following references: Manes, U.S. Pat. No. 4,502,099, Garner, U.S. Pat. No. 4,648,007 and the patents to Gourdine, U.S. Pat. Nos. 5,297,005 and 5,422,787. Gourdine's patents describe a cabinet or chassis in which one or more electronic components are individually isolated and subject to separate airflow in order to maximize the cooling of all the components in the cabinet.

By making the aperture allowing heat to escape from the chassis larger, the capacity for cooling of the chassis is improved. Hence, large apertures are desirable. They allow increasing numbers of heat-generating components to be incorporated within the chassis and yet the chassis can operate within an acceptable temperature window.

In accordance with prior art techniques, there are limits and constraints on aperture size for warm air egress. The reason is that these types of telecommunications devices are also at least theoretically capable of catching fire should a short circuit or other type of malfunction occur in the electronic components. Various industry standards bodies frequently require that any fire that may break out within the device be contained within the device. While the semiconductor components themselves are not particularly flammable, epoxy and other materials used in the circuit boards are quite flammable. Should the chassis catch fire and the flames migrate out of the chassis, the room or building in which the chassis is installed is therefore also at risk of catching fire, a situation presenting an obvious hazard to life and property.

Patents directed to fire containment features for residences, and other types of buildings include the following references: Petit, U.S. Pat. No. 3,818,816 and Schaus, U.S. Pat. No. 4,805,835. However, to the inventor's knowledge, the art has never applied these teachings to communications or similar devices. One possible reason is that the complex problem of cooling, air flow, and fire containment in a telecommunication device or similar type of structure is quite different from fire containment issues pertaining to a dwelling, office building, or the like.

A chassis which on the one hand has a generous aperture for cooling purposes and good air flow characteristics, but which also provides features for preventing flames from migrating out of the chassis via the aperture, has apparently eluded the art. This invention provides features which not only allows for optimum cooling and air flow during periods of normal operation of the chassis, but also provides a fire containment feature which blocks the aperture to prevent fire or flames from escaping from the chassis and thereby provide increased safety for the device. As such, the present invention is believed to be a substantial advance in the art.

While the invention is described below in the context of one type of telecommunications chassis, namely a device terminating T1 spans in a telephone company central office, it will be readily apparent to persons skilled in the art that the invention is capable of wide application in other types of devices and the invention is certainly not limited to any particular type of communications device or chassis. For example, the invention could be incorporated into a personal computer or workstation. Thus, the scope of the invention is to be determined by reference to the appended claims. It is not intended to be limited to the example in the following detailed description. Hence the tern "chassis", as used in the specification and claims, is intended to encompass any unitary electronics device, such as a telecommunication or networking device, contained within a housing, regardless of the function performed by the device. The term chassis would therefore embrace, for example, a network access server, switch, router, T1 span termination shelf, workstation, personal computer, television set or any other similar type of device.

SUMMARY OF THE INVENTION

In a first aspect of the invention, an improvement to a chassis is provided. The chassis includes a housing containing a plurality of electronic components which generate heat during normal operation of the chassis. The improvement comprises providing an aperture in the housing to permit the flow of air therethrough and a moveable door for the aperture. The door is maintained in a normally open condition relative to the aperture by a temperature sensitive material during periods of normal operation of the chassis. The temperature sensitive material is transformable upon exposure to sufficient heat or flame within the chassis so as to cause the door to move to a closed condition relative to the aperture, thereby substantially preventing migration of any flame occurring within the chassis through the aperture.

In one possible embodiment, the temperature sensitive material, such as a liquid crystal polymer filament, holds the door open against the force of gravity (e.g., against the top of the chassis), but melts upon exposure to sufficient heat or flame to release the door and allow the door to drop or pivot into a closed position covering the aperture. In another possible embodiment, the temperature sensitive material undergoes a transformation to cause a switch to close, whereby a motor or other device closes the door. The use of a material that melts upon exposure to sufficient heat or flame is a preferred technique, since it will work regardless of the state of operation of any electronic components in the chassis, e.g., switches or motors, which may not be working in the event of a fire.

The manner in which the temperature sensitive material maintains the door in an open condition relative to the aperture during periods of normal operation is not particularly critical. For example, the temperature sensitive material may simply have one portion connected to the door and another portion connected to the housing, wherein the temperature sensitive material simply holds the door open against the force of gravity or the force of a spring. When the material undergoes the transformation by heat or flame, it releases the door and allows the spring, or gravity, to act on the door to close the door. For example, an elongate polymeric filament, such as thin nylon line, may hold the door open relative to the aperture. When the nylon line melts, the door falls or pivots to a closed condition, or is pulled closed by a spring.

In a preferred embodiment of the invention, the door is incorporated into a replaceable shutter assembly that is insertable and removable relative to said chassis. Should the door or temperature sensitive material need to be serviced by a technician or the user for any reason, the entire shutter assembly, including door and temperature sensitive material, can be removed and serviced without interfering with ongoing operation of the chassis. In this embodiment, the shutter assembly includes a structural portion (such as a mounting plate) that engages the housing. The door is supported against the mounting structure by the temperature sensitive material. When a fire occurs inside the chassis, the temperature sensitive material transforms (e.g., melts) to allow the door to move relative to the mounting structure to close or cover the aperture. In this embodiment, the temperature sensitive material need not directly contact or engage the housing; rather it engages the mounting structure which is part of the replaceable shutter assembly. This makes servicing of the fire containment feature much easier, and does not require any complicated disassembly of the chassis that might interfere with ongoing operation of the chassis.

In another aspect of the invention, a chassis is provided comprising a housing having side walls, a rear wall and a top surface. A plurality of cards are arranged in a array in the housing, with the cards insertable into and removable from the housing. The cards contain one or more electronic components generating heat during operation of the chassis. An elongate aperture is provided in the rear wall for permitting warm air generated within the housing to escape into the environment to thereby cool the cards and maintain the proper temperature inside the chassis. The aperture extends across the rear wall in an upper region thereof above and behind the plurality of cards.

A grille is provided which extends across the upper region of the rear wall. The grille covers the aperture, thereby preventing any fingers or foreign objects from entering the chassis. A trap door or shutter is provided for the aperture which is moveable relative to the housing between a first position, in which the door does not cover the aperture, and a second position, in which the door substantially obstructs the aperture. A temperature sensitive material is provided which is operatively associated with the trap door. The temperature sensitive material is connected or otherwise configured with respect to the trap door whereby the temperature sensitive material is transformed (such as by melting) upon exposure to sufficient heat or flame within the chassis so as to cause the trap door to move to the second position relative to the aperture, thereby substantially preventing migration of any flame within the chassis through the aperture.

The trap door, in a preferred embodiment, is incorporated into a replaceable shutter assembly that is insertable and removable relative to the chassis, whereby the shutter assembly may be inserted or removed from the chassis without interfering with ongoing operation of the chassis.

In a preferred embodiment, the aperture and trap door extend along the length of the rear wall of the chassis in registry with the array of cards. The temperature sensitive material takes the form of an elongate liquid crystal polymeric filament, or a light nylon filament. The filament extends the entire length of the trap door and holds the door in the open position against the force of gravity. The filament may be connected directly to the trap door, or more preferably has its ends connected to the housing or other fixed structure (such as the mounting structure described herein) and merely supports the bottom surface of the trap door in an open condition. If a fire develops in the chassis, the heat and/or flames contact the filament to melt the filament, causing the door to swing, drop, or otherwise move to a closed condition relative to the aperture, thereby preventing flames from migrating out of the chassis via the aperture.

In still another aspect, a replacement fire containment shutter assembly is provided for a telecommunications chassis. The shutter assembly is insertable into the chassis and removable from the chassis, allowing the shutter assembly to be serviced without interfering with the ongoing operation of the chassis. The replacement shutter assembly comprises a mounting structure which is adapted to engage the chassis. For example, the mounting structure may have flanges or other features which engage with corresponding structures in the housing to allow the replacement shutter assembly to be installed in a secure fashion in the housing. The details of how the mounting structure engage the housing are not important.

The replacement shutter assembly includes a trap door that is moveable relative to the mounting structure by means of a hinge or other suitable structure. A temperature sensitive material such as filament is provided to connect or otherwise engage the trap door to the mounting structure. Preferably, the filament comprises a first end and a second end and an intermediate portion. The first and second ends are connected to the mounting structure, and the intermediate portion supports the trap door against the mounting structure against the force of gravity whereby, when the filament is exposed to sufficient heat or flame within the chassis, the filament melts to thereby release the trap door from its engaged position relative to the mounting plate and fall, pivot, or otherwise move to a closed condition relative to the aperture in the housing.

In a preferred embodiment, the trap door is given a substantial planar surface having a dimension greater than or equal to the length of an array of cards installed in the chassis. Furthermore, the aperture is also given sufficient length such that is extends along the length of the array of cards. The filament runs along the entire length of the trap door, and supports the trap door from below immediately above all of the cards. Consequently, a fire in any of the cards, regardless of its location in the chassis, will provide heat or flames proximate to the filament and cause the trap door to be released to close the aperture before the flames have had a chance to migrate out of the chassis.

BRIEF DESCRIPTION OF THE DRAWINGS

A presently preferred embodiment of the invention is described below in conjunction with the appended drawing figures, wherein like reference numerals refer to like elements in the various views, and in which:

FIG. 6 is a perspective view of the T1 span termination shelf of FIG. 5, with the trap door in a closed condition as it would be in case of fire;

FIG. 7 is another perspective view of the chassis of FIGS. 5 and 6, showing the trap door and grille features of the chassis in an open condition;

FIG. 8 is a perspective view of a replaceable fire restraint shutter assembly including a trap door, with the assembly designed to be insertable and removable from the chassis of FIGS. 5–7;

FIG. 9 is another perspective view of the shutter assembly of FIG. 8;

FIG. 10 is a side elevational view of the shutter assembly of FIGS. 8–9;

FIG. 11 is a plan view of the underneath surface of the shutter assembly of FIGS. 8–10, showing the trap door connected to a mounting structure by means of a hinge which allows the trap door to pivot relative to the mounting structure;

DETAILED DESCRIPTION OF THE PREFERRED EMBODIMENT

Figure 1:
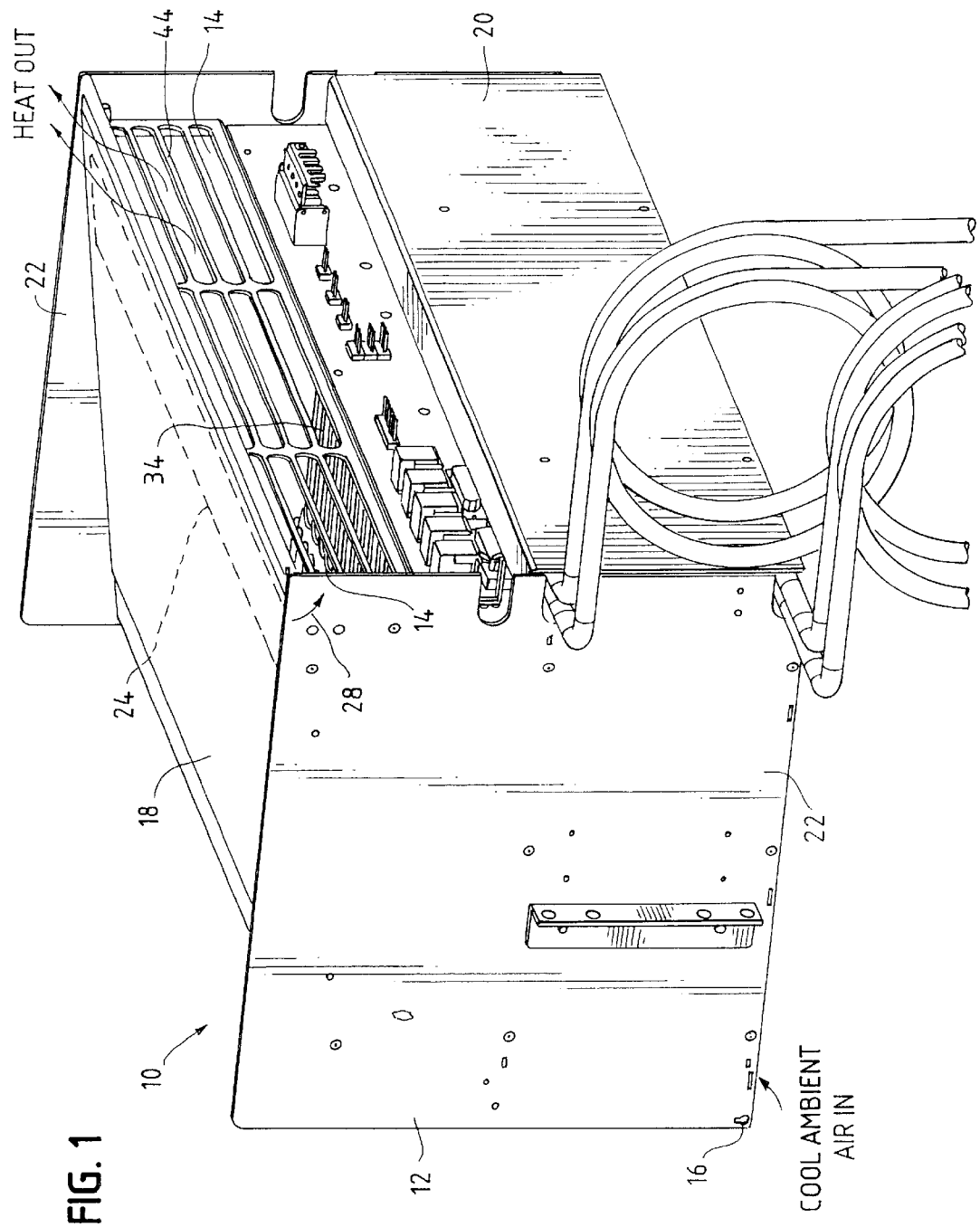
FIG. 1 is a perspective view of a chassis or device showing a fire containment trap door in an open condition relative to an aperture in the device, thereby allowing warm air to escape from the chassis and keep electronic components inside the chassis cool.

Referring now to FIG. 1, a chassis 10 is shown in a perspective view having a housing 12 for containing a plurality of electronic components (not shown) that generate heat during operation of the chassis. An aperture 14 is provided in the housing to permit the flow of air therethrough. In particular, relatively cooler, ambient air is introduced into the lower portion 16 or bottom of the chassis, circulated within the chassis possibly by means of one or fans (not shown). The air is warmed by heat radiated by the electronic components in the chassis and rises until it meets a heat baffle forming the top surface 18 of the chassis 10. The top surface 18 is given a slanted configuration so that the warm air rises to the apex of the chassis in the top of the rear surface 20 of the chassis where the aperture 14 is located.

Figure 2:
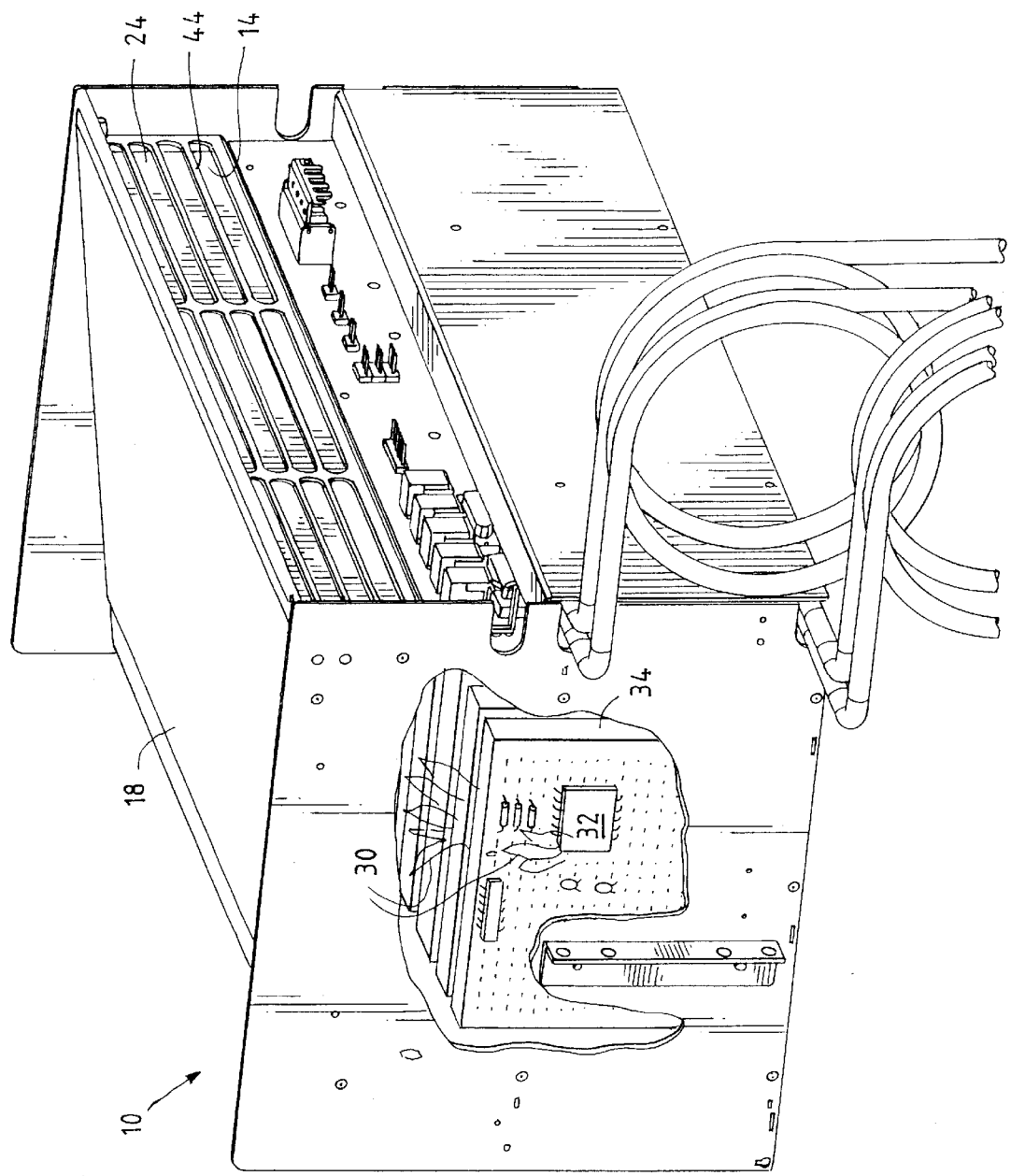
FIG. 2 is a perspective view of the chassis of FIG. 1, showing a fire occurring in the chassis and the trap door moved to a closed condition to block any flames from migrating from the chassis.

During normal operation of the chassis 10, it is critical that this warm air escape so as to avoid overheating the electronic components in the chassis. Further, providing a large aperture promotes more efficient cooling of the chassis. In a preferred embodiment there is no need for a fan. Several factors contribute to this. First, aperture 14 is given a large size. The aperture runs the entire width of the chassis. Second, the electronic components generating heat are all positioned in the lower portion of the chassis, as shown in FIG. 2. Third, the increased height of the side walls 22 and rear surface 20 thereby provide a relatively larger volume of space for the warm air to rise, away from the electronic components.

To enable the warm air to escape during normal operation, but prevent flames from migrating from the chassis in case of fire, I have provided a moveable trap door 24 for the aperture. The trap door 24, shown in dashed lines in FIG. 1, is maintained in a normally open condition relative to the aperture 14 by a temperature sensitive material. The temperature sensitive material may be an elongate polymeric filament such as a light nylon line, or other suitable material. In any event, the temperature sensitive material is transformed (e.g., melts) upon exposure to sufficient heat or flame within the chassis so as to enable the trap door 24 to move to a closed condition relative to the aperture 14. The door may simply be released and fall or pivot by gravity as indicated by the arrow 28, or it may be assisted by a spring or other mechanical device, or it may be moved by a motor in an less preferred embodiment. In the closed condition, the door 24 blocks the entire length of the aperture 14 and thereby substantially prevents migration of any flame occurring within the chassis through the aperture.

FIG. 2 illustrates this operation of the trap door to close the aperture. A flame 30 occurs inside the chassis due to a short circuit or other malfunction. The flame 30 melts a filament holding the door 24 to the heat baffle or roof 18, causing the door 24 to swing to a closed condition covering the aperture 14 and blocking migration of any flames outside of the chassis.

Figure 3:
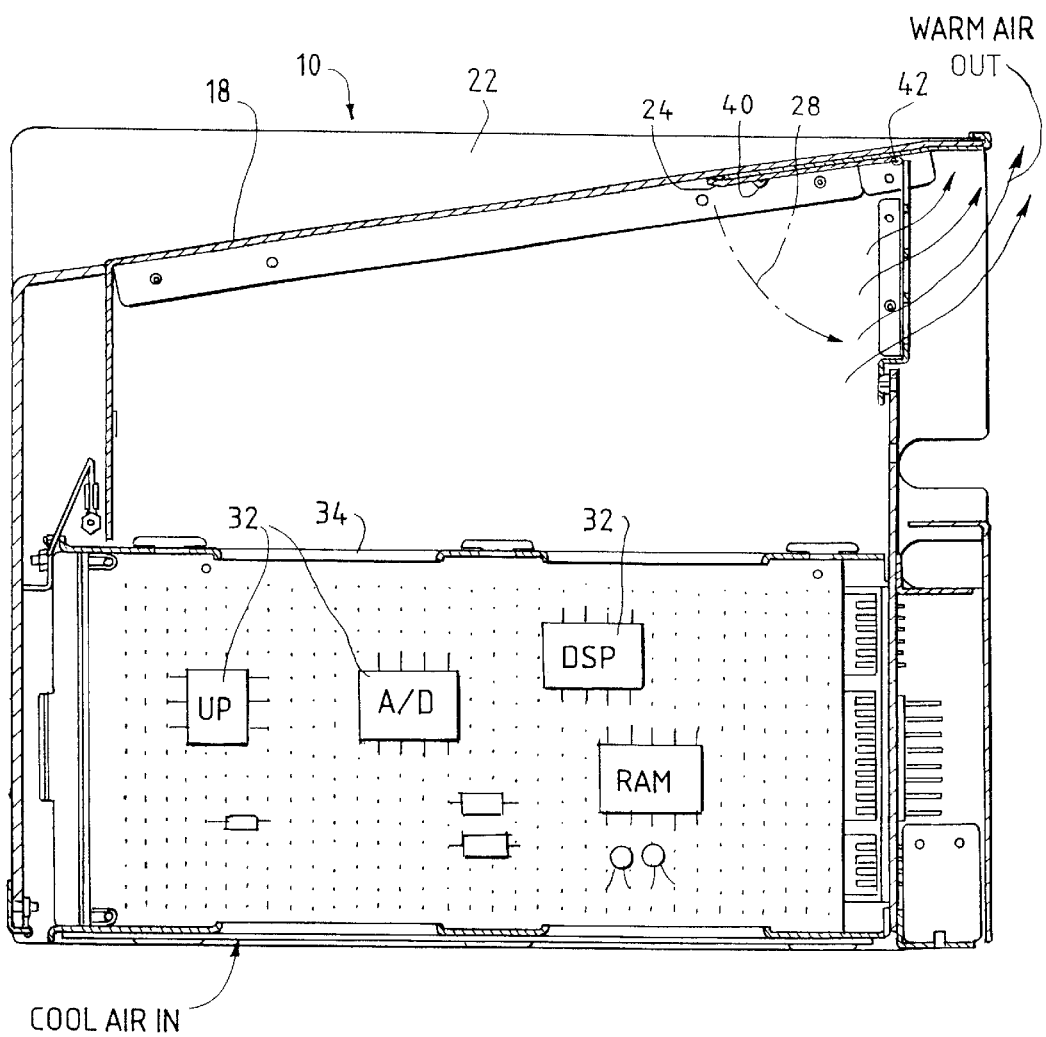
FIG. 3 is a cross-sectional view of the chassis of FIG. 1 showing a temperature sensitive material holding the trap door open during normal operation of the chassis.
Figure 4:
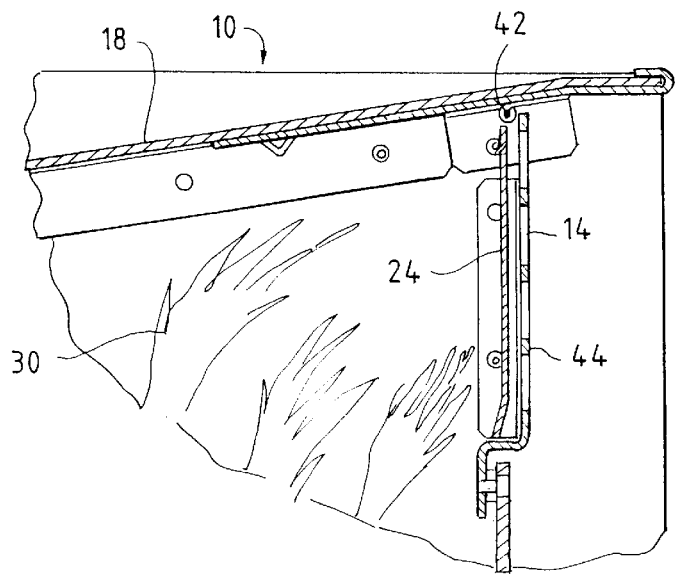
FIG. 4 is a cross sectional view of the chassis of FIG. 4 showing the temperature sensitive material having undergone a transformation, such as melting, thereby releasing the trap door and allowing it to move to a closed position relative to the aperture.

FIG. 3 is a cross-sectional view of the chassis showing electronic components 32 arranged in a card 34 inside the chassis 10. During normal operation, the heat 36 given off by the card 34 rises to the top of the chassis, hits the heat baffle 18 and exits via the aperture 14. The door 24 is retained against the heat baffle by a polymer cord 40. As shown in FIG. 4, the polymer cord has melted due to excessive heat or flame 30 occurring inside the chassis, causing the door 24 to swing about a hinge 42 to a closed condition blocking flames from migrating out the aperture 14. The polymer cord 40 of FIG. 3 could melt by virtue of flames contacting the polymer cord itself, or simply by elevated temperatures in the vicinity of the polymer cord but without the presence of flame.

FIGS. 1–4 also show a grille 44 that is incorporated into the housing to cover the aperture 14 and prevent the user's fingers or other foreign objects from entering the housing. The grille 44 could be either fixed and integral with the rear surface of the chassis 10, or could be a separate item as shown in the embodiment of FIGS. 5–7 and 12–15.

Figure 5:
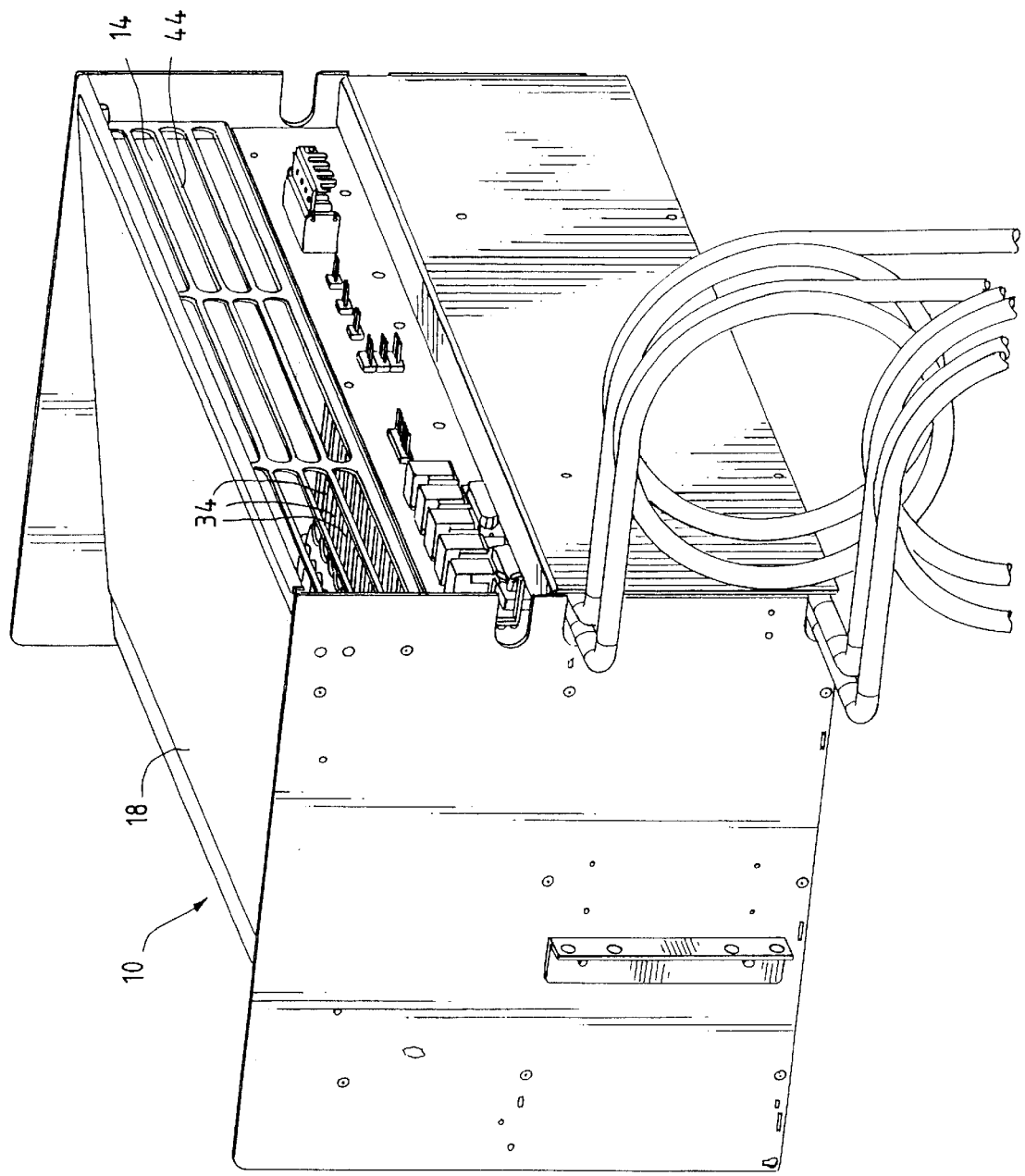
FIG. 5 is a perspective view of a T1 span termination shelf incorporating the trap door features of the present invention, with the trap door in an open condition.

FIG. 5 is a perspective view of a chassis functioning a T1 span termination shelf incorporating the trap door features of the present invention. The T1 span termination shelf terminates T1 digital telephone lines in a telephone company central office. The operation of the device is obviously not important to the features of this invention and therefore will be omitted. FIG. 5 shows the aperture 14 and grille 44, and a plurality of manually insertable cards 34 arranged in an array inside the chassis 10. The cards 34 run the entire length of the chassis. Therefore, the aperture 14 is likewise provided along the top of the rear surface 22 of the chassis along the entire length thereof. This provides a relatively large aperture for warm air generated by the cards 34 to escape through the aperture 14 and into the environment.

The trap door feature of the embodiment of FIG. 5 is not shown in the figure, but is shown in the subsequent figures. Basically, it is held out of the way above the aperture 14 and immediately below the heat baffle/top surface 18 by means of a polymer cord. In a preferred embodiment, the trap door is part of a replaceable fire restraint shutter assembly that is insertable and removable relative to the chassis 10. The fire restraint shutter assembly may be removed from the chassis and serviced (or replaced) by a technician without interfering with ongoing operation of the chassis or requiring any time consuming disassembly of the chassis. The fire restraint assembly is shown in FIGS. 7–13 and described subsequently.

FIG. 6 shows the door 24 having been moved to a closed condition relative to the aperture 14 against the grille 44 to thereby block any flames occurring in the chassis from escaping via the aperture 14.

FIG. 7 is another perspective view of the chassis of FIGS. 5 and 6, showing the trap door and grille features of the chassis in an open condition. The trap door is incorporated in a fire restraint shutter assembly 50 that inserts into the chassis in a manner described in further detail below. The grill 44 pivots relative to the side walls 22 in order to facilitate insertion and removal of the assembly 50. The assembly 50 is removed from the chassis by unscrewing a screw on both of the side walls 22 and sliding the assembly out of the top of the chassis. The grille 44 is kept attached to the chassis, and is capable of pivoting relative to the side walls 22 when two retaining screws in the side walls are also removed, and three screw on the lower face of the grille 44 attaching the grill to the rear wall 22 are removed. These features are of course not particularly important and the grill could remain fixed if desired.

FIG. 8 is an isolated perspective view of the fire restraint shutter assembly 50 of FIG. 7. The assembly 50 includes an elongate, substantially planar mounting plate 52 having a curled, U-shaped edge 54. The edge 54 slides over and thereby engages with the extreme upper edge of the heat baffle/top surface 18 of the chassis 10 when the assembly is installed in the chassis 10. The mounting plate 52 thus provides a mounting structure for fixedly retaining the fire restraint shutter assembly 50 to the rest of the chassis. The mounting plate 52 has a pair of opposed flanges 56 having an aperture 58. The flanges 56 are used to correctly position the assembly 50 in the chassis (as will be more apparent by reference to FIGS. 12–14). The apertures 58 allow a screw to fasten the mounting plate 52 to the side walls 22 of the chassis.

The mounting plate 52 further includes a pair of V-shaped features 60 to which the ends 62 and 64 of a polymer cord or other suitable elongate filament 40 are attached. The filament 40 has an intermediate portion 66 extending the entire length of the mounting plate and serves to hold the trap door 24 against the bottom surface of the mounting plate 52. The trap door or shutter 24 is welded to one leaf of a hinge 70, with the other leaf of the hinge 70 welded to the mounting plate 52. Therefore, when the filament 40 melts anywhere along its length due to flame or heat in the chassis, the filament falls away from the trap door 24 and the trap door is thereby able to swing via the hinge due to gravity and move relative to the fixed mounting plate 52 to a position in which it abuts against the grille 14 and blocks the aperture as shown in FIG. 6.

FIG. 9 is another perspective view of the replaceable fire restraint shutter assembly 50 of FIG. 9, shown from above. In a preferred embodiment, the mounting plate 52 and door 24 are given a dimension or length L such that they extend substantially the entire length of the rear wall 20 of the chassis. In the illustrated embodiment, the manually insertable cards or circuit boards are arranged in an array and likewise extend the substantial length of the chassis 10, and the aperture 14 in the top of the rear wall 20 also extend substantially the entire length of the chassis. The reason for this design is that a fire may break out in any of the cards in the array, and the flame and excess heat due to the fire may initially be a localized phenomenon. Nevertheless, due to the assembly 50 being positioned in registry above all of the cards, and in particular due to the temperature sensitive cord or filament 40 also extending the full length of the chassis above the cards, wherever the fire may break out it will necessarily be in a region in close proximity to some portion of the filament. Accordingly, wherever the flame and heat may be initially, it will melt the filament 40 somewhere along its length. The filament 40 will therefore fall away from the door 24 due to gravity and allow the trap door 24 to also fall and pivot about the hinge to a closed condition abutting the grille 44 and closing off the aperture 14.

FIG. 10 is an end view of the fire restraint shutter assembly 50, showing in better detail the U-shaped curled edge 54 of the mounting plate 52, the V-shaped feature 60 to which the ends of the filament are tied, and the flange 56. FIG. 10 also indicates by the arrow 72 illustrating the movement of the door 24 relative to the mounting plate 54 via the hinge 70.

FIG. 11 is a bottom plan view of the fire restraint shutter assembly 50, showing in better detail the hinge 70. The hinge 70 has a leaf 76 that is welded to the bottom surface of the mounting plate 52 as indicated by the points 80, and a second leaf 78 that is welded to the top surface of the door or shutter 24. Note also the temperature sensitive filament or cord 40 running the entire length of the assembly 50 between the opposed V-shaped features 60 in the mounting plate 52.

Figure 12:
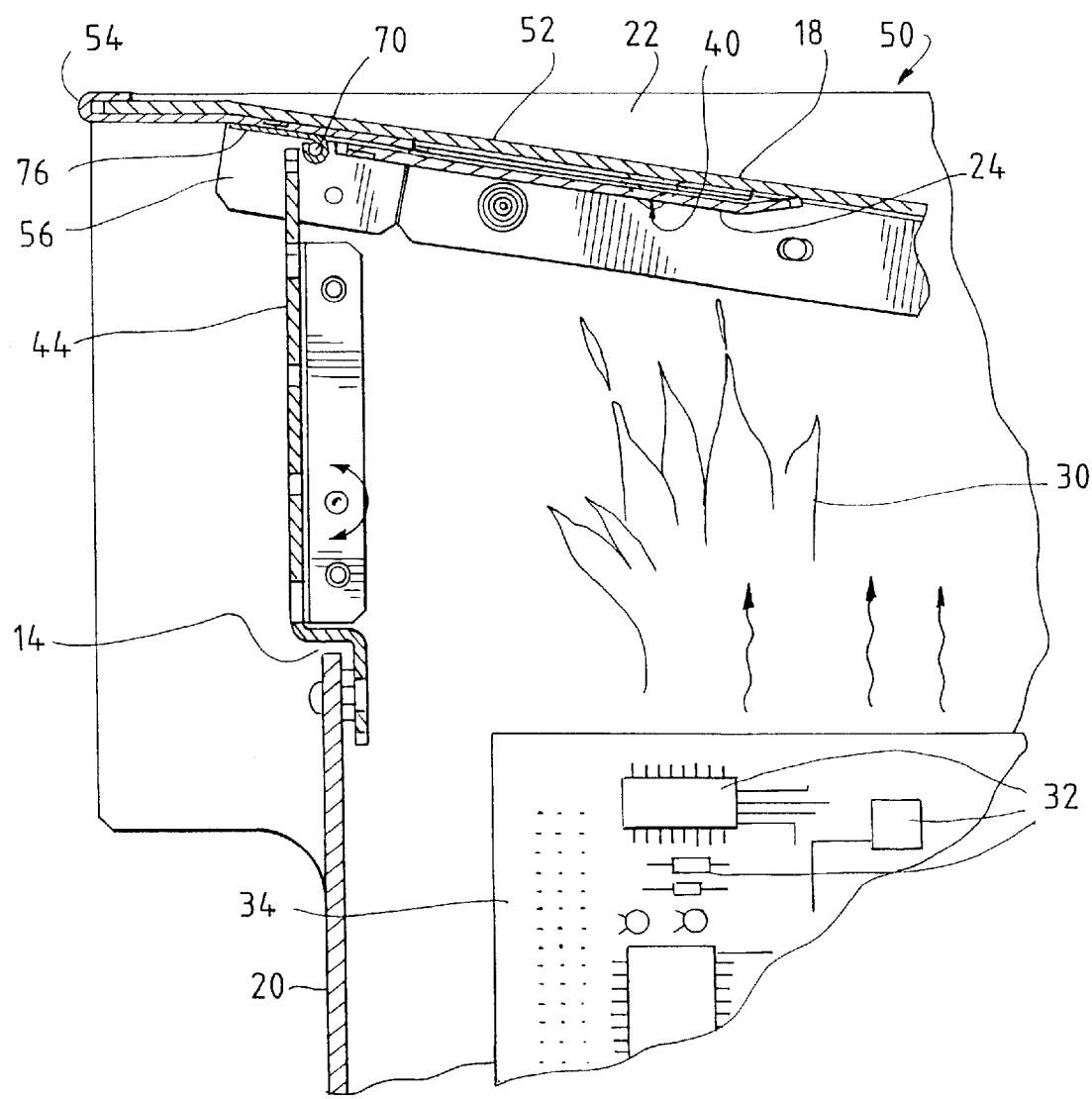
FIG. 12 is a cross-sectional view of the upper rear portion of the chassis of FIG. 5 with the shutter in the open position, showing a fire breaking out in the chassis and flames rising to the vicinity of the filament retaining the trap door against the mounting structure, immediately prior to the melting of the filament.
Figure 13:
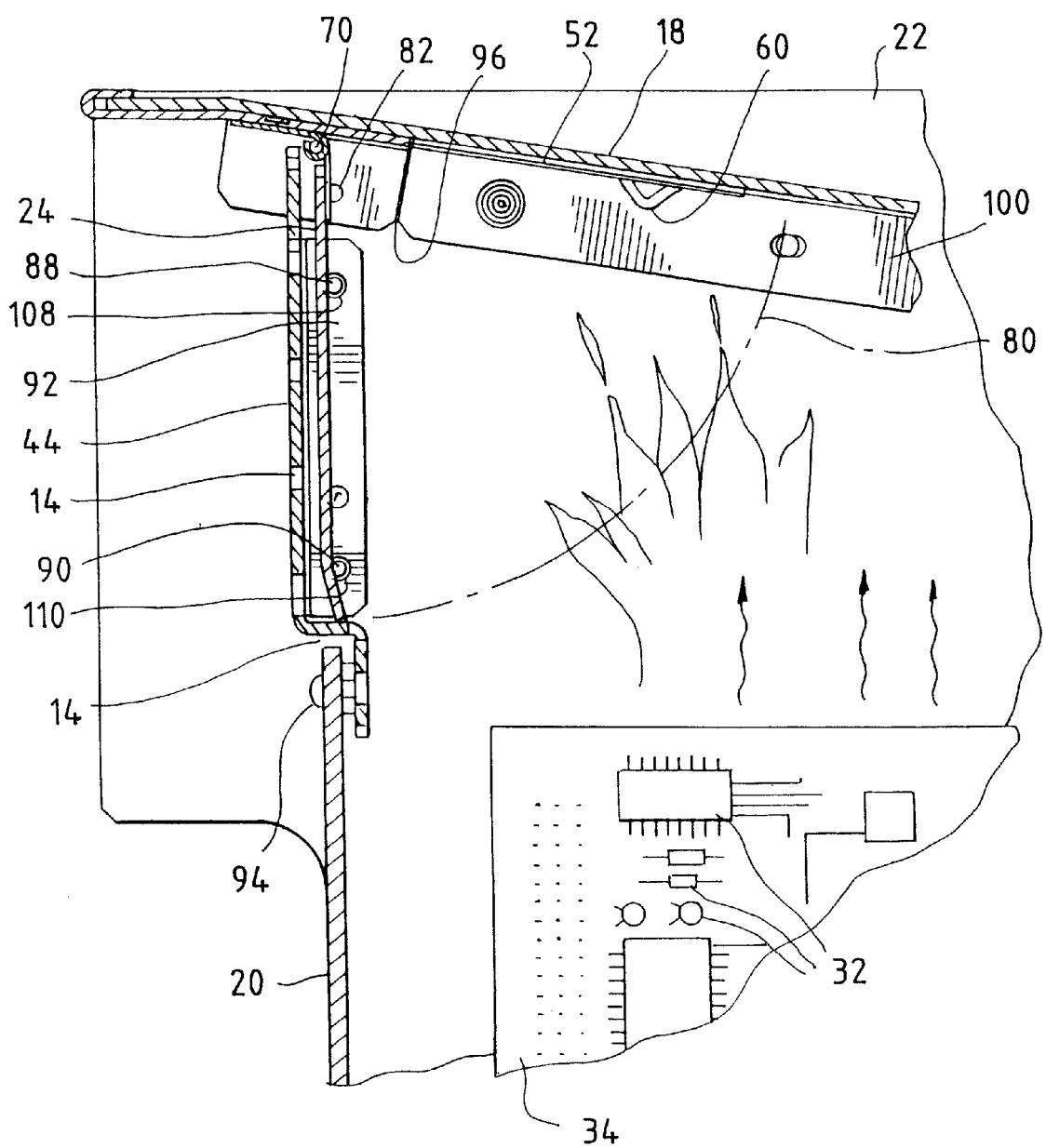
FIG. 13 is another cross section of the chassis similar to FIG. 12, showing the trap door swinging to the closed position when the filament melts.

FIGS. 12 and 13 illustrate the operation of the assembly of FIGS. 8–11. FIG. 12 is a cross-section of the chassis taken at some arbitrary point along the length of the aperture 14, grille 44 and fire restraint shutter assembly 50. FIG. 12 also shows a card 34 having a plurality of electronic components 32 that are generating heat. During normal operation, the filament 40 retains the trap door 24 out of the way, abutting the lower surface of the mounting plate 52, allowing heat to exit thought the grille 44 covering the aperture 14 in the top of the rear surface 20 of the chassis. Should a fire break out, as indicated by flames 30, the heat and or flames will cause the filament 40 to melt, resulting in the movement of the trap door or shutter 24 to the position shown in FIG. 13 via the hinge 70, as indicated by the line 80. In the position shown in FIG. 13, the door 24 blocks the aperture 14 and prevents the flames 30 from migrating out of the chassis.

Figure 14:
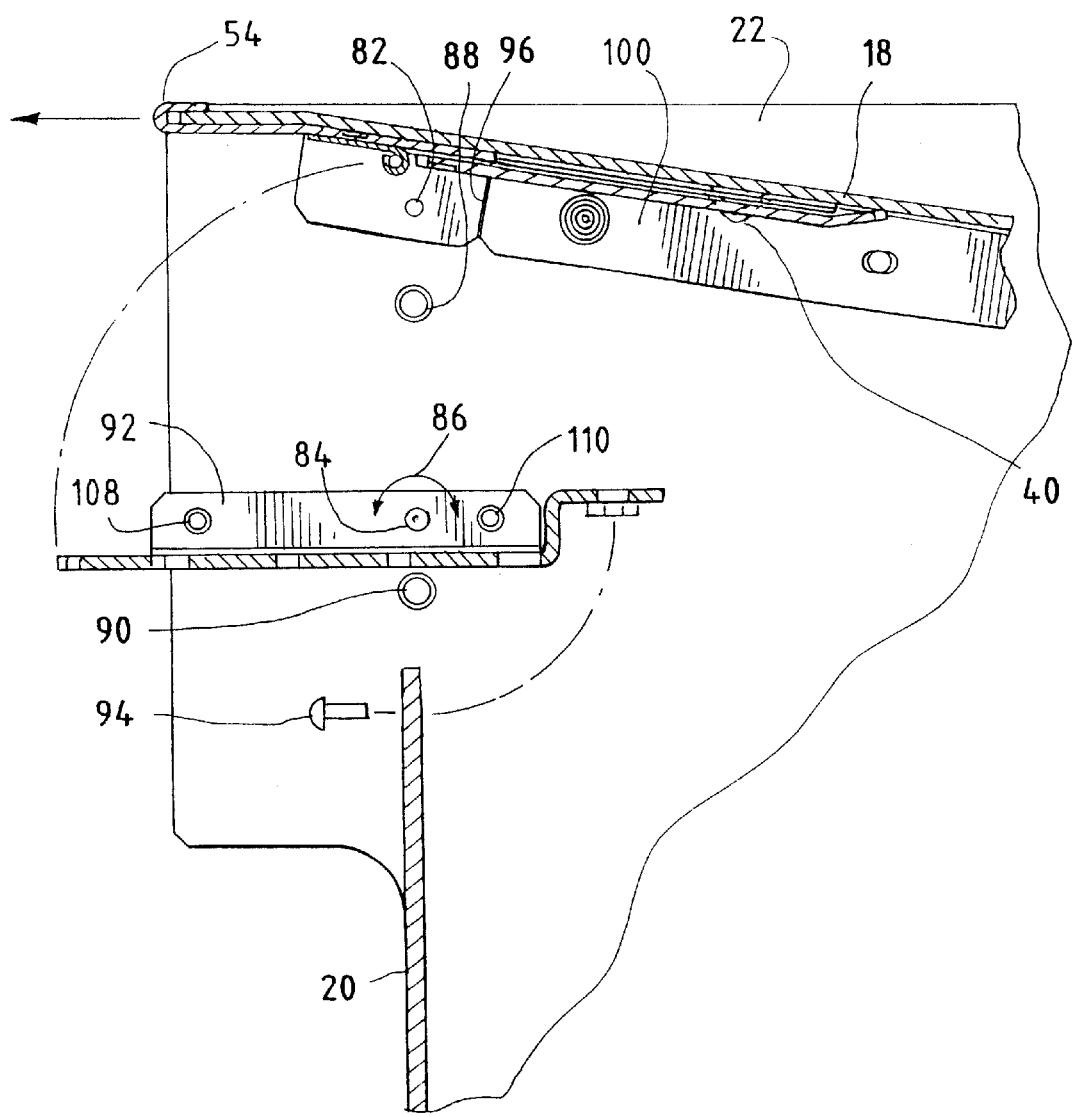
FIG. 14 is another cross-section of the chassis similar to FIGS. 12 and 13, showing the removal of the entire fire restraint shutter assembly from the housing for servicing the assembly, with the grill covering the aperture in the housing pivoted down to ease the removal of the fire restraint shutter assembly.

FIG. 14 shows the operation of the pivot down grill 44 and fire restraint shutter assembly 50 during removal of the assembly 50. Referring now to FIGS. 13 and 14, a screw 82 fastening the flange 56 of the mounting plate is removed from both side walls 22 of the housing. Now, the U-shaped curled edge 54 of the mounting plate 52 is free to disengage from the extreme left hand edge of the baffle/top surface 18 of the housing. The entire assembly 50 can be slid out from the chassis as a unit. To assist in this process, the grill 44 pivots relative to the side walls 22 of the housing at the points 84 as indicated by the arrow 86 in FIG. 14. First, however, two screws 88 and 90 attaching the side flanges 92 of the grille 44 must be removed from both side walls 22. Additionally, three screws 94 spaced along the length of the grille 44 that attach the grille 20 to the rear wall 20 of the chassis must also be removed. When all these screws have been removed, the grille 44 can pivot about the point 84 to the position shown in FIG. 14. This aids in insertion and removal of the fire restraint shutter assembly 50 and visual inspection of the assembly after it has been installed.

FIGS. 13 and 14 also show the abutment of the edge 96 of the mounting plate flange 56 against a plate 100 fastened to the wall 22. This serves to accurately align the mounting plate 52 relative to the wall 22 and allow the screw hole for the screw 82 to be properly and easily aligned when the mounting plate is installed.

Figure 15:
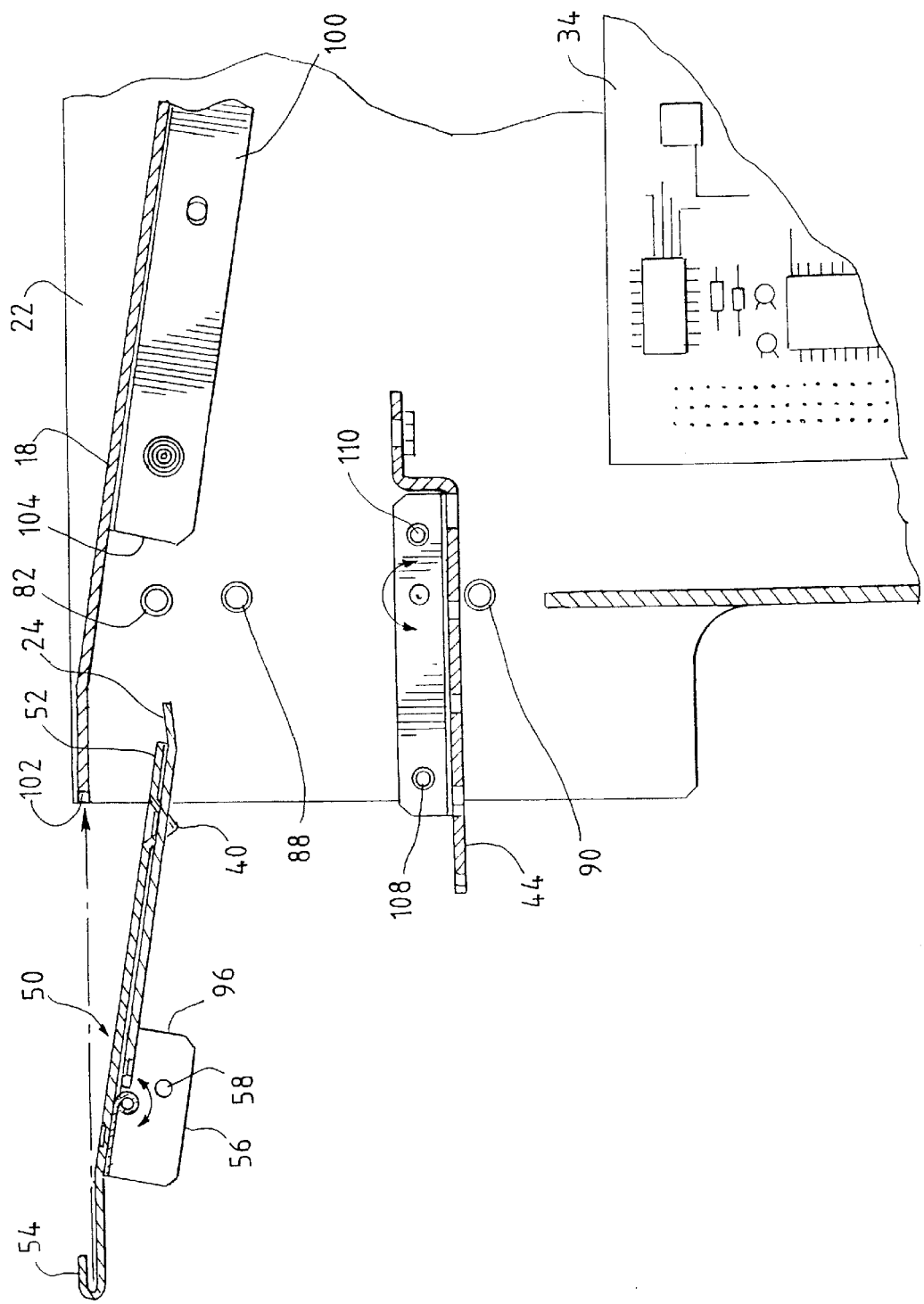
FIG. 15 is another cross-section of the chassis of FIG. 5, showing the installation of the fire restraint shutter assembly.

FIG. 15 shows the assembly 50 being installed. The curled U-shaped edge 54 slips over and engages the peripheral edge 102 of the heat baffle 18, until edge 96 of flange 46 abuts the edge 104 of the plate 100. A mounting screw 82 then attaches the flange 54 to the side wall of the housing 22 via the hole 58. Similar operations occur on the other side of the assembly 50 on the wall opposite to side wall 22. The grille 44 is then rotated as indicated in FIG. 14 to an upright position and fixed in place be means of the screws 88 and 90 of FIG. 14 being inserted into the side wall 22 and engaging the holes 108 and 110, respectively, in the grille flange 92 as shown in FIG. 13.

Suitable materials for the cord 40 include the liquid crystal polymer cord sold under the VECTRAN trademark, available from Fiber-Line, Inc. of Charlotte, N.C. Other possible materials are polymeric cords having a melting point of between 250 and 350 degrees C, such as cords made from nylon, polyethylene napthalate and polyester.

Figure 16:
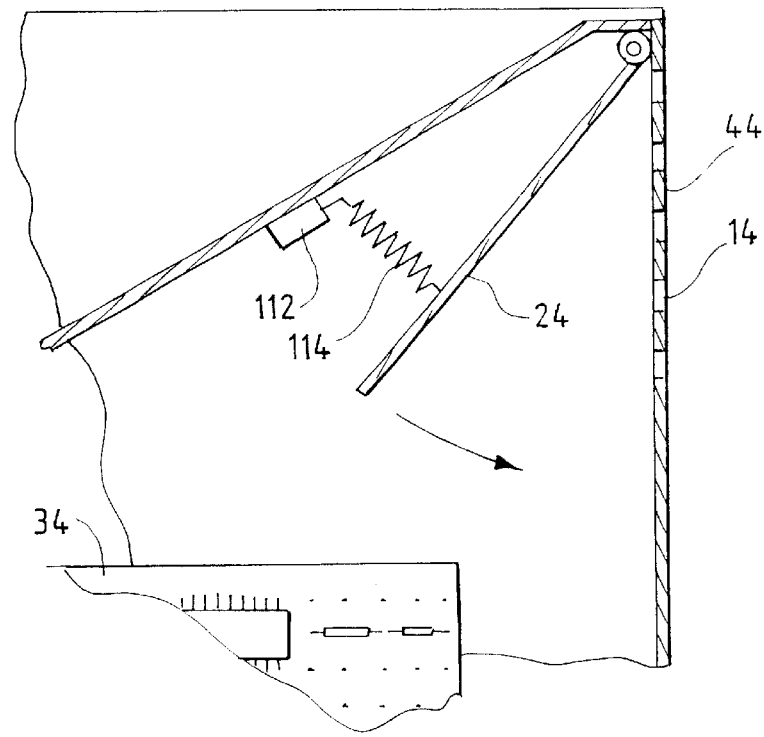
FIGS. 16–18 show additional, but less preferred, arrangements by which the trap door may be closed in case of fire in a chassis.
Figure 17:
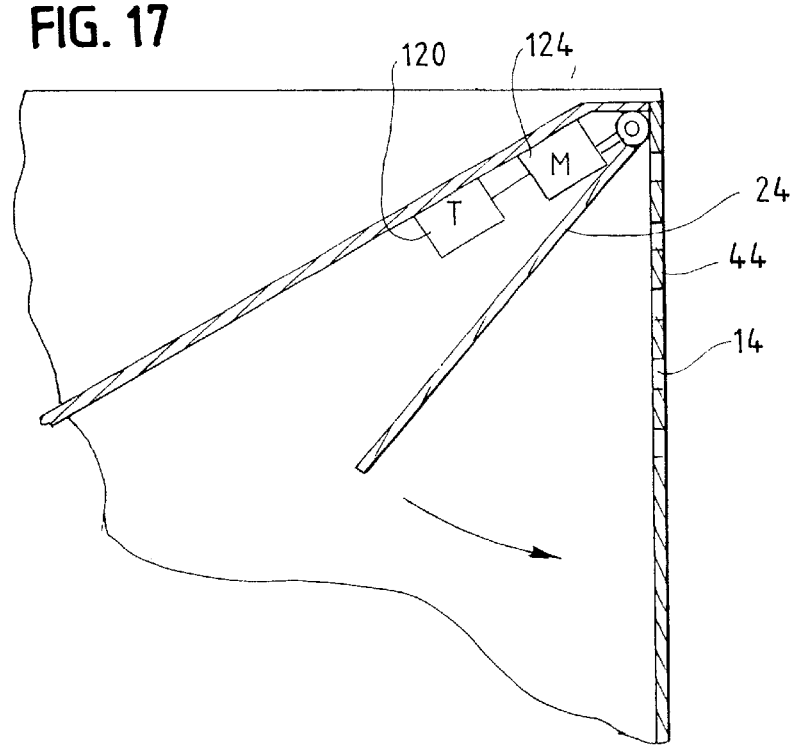
Figure 18:
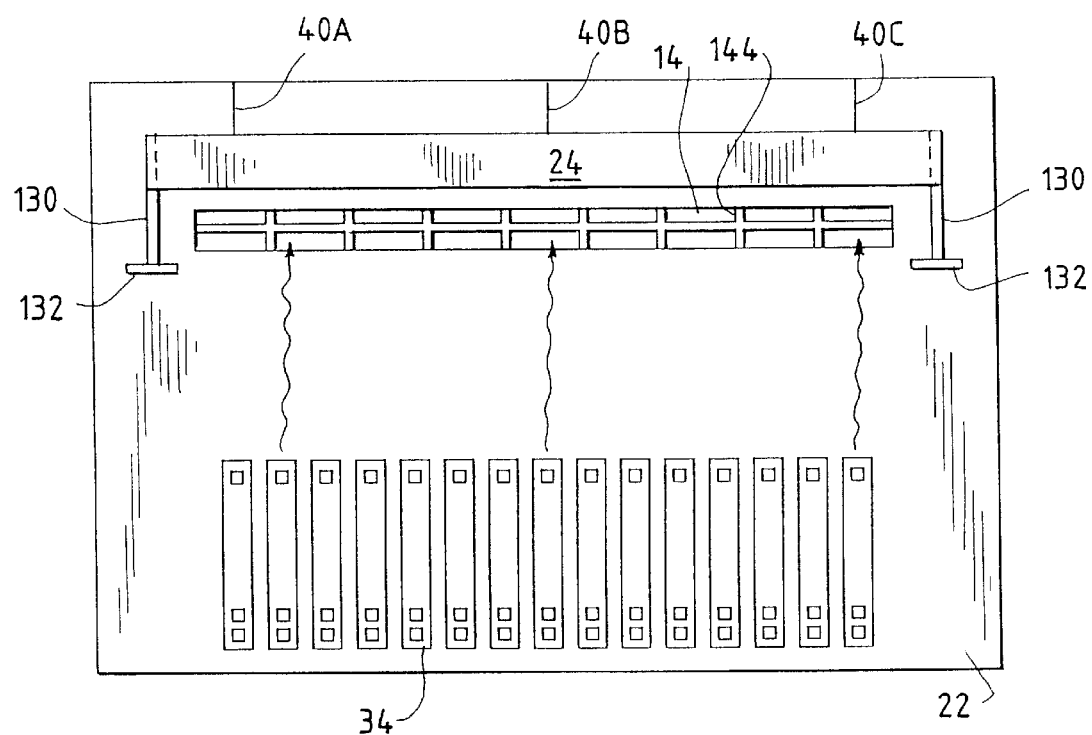

There are other possible embodiments for retaining the trap door out of the way of the aperture when the chassis is operating normally, but moving the trap door to a closed position relative to the aperture when a fire occurs. One way is using a thermocouple across the shutter plate that activates a motor that closes the door, and when it cools the motor operates to open the door. FIGS. 16–18 show several additional possibilities for operating the door 24 in case of fire in the chassis 20. In FIG. 16, in case of fire, a temperature sensitive material in a switch 112 is actuated upon sufficient heat generated in the chassis to release a spring 114 that pushes the door 24 against the grille 44 in a closed position to cover the aperture 14. In FIG. 17, a temperature sensitive material in a thermistor 120 senses when there is a fire in the chassis. The thermistor 120 is part of a circuit that includes a motor 124. The motor is operatively connected to the door in any convenient manner and closes the door when the thermistor indicates that a fire is present in the chassis. In FIG. 18, the door 24 is held vertically above the aperture by three filaments 40A, 40B and 40C. The filaments have one end connected to the door and another end affixed to the top surface of either the rear panel 20 or the top of the chassis. The door 24 moves relative to the aperture 14 along slides 130 arranged on opposite sides of the aperture. A pair of stops 132 are provided at the base of the slides 130 and limit the travel of the door. In the event of a fire in the cards 34, the filaments 40A, 40B and 40C all melt allowing the door to fall along the slides 130 due to gravity to a closed position, covering the aperture 14. Only one filament 40B could possibly be used. The embodiment of FIG. 8 is considered a better alternative to FIG. 18 since the embodiment of FIG. 18 requires heat or flame in three locations to release the door 24, whereas in the embodiment of FIG. 8 flame or heat anywhere along the door 24 will melt the filament.

From the foregoing, it will appreciated that I have described a chassis 10 for housing a plurality of electronic components (such as shown in FIG. 5, 13, or 18) with fire containment capability. The chassis includes a housing 12, at least one card 34 insertable into and removable from the housing (such as indicated in FIGS. 5 and 18) with the card containing at least one electronic component generating heat during operation of the chassis, such as a digital signal processor, microprocessor, integrated circuit chip or any other type of component, the details of which are unimportant. An aperture 14 is provided for permitting warm air generated within the housing to escape into the environment to thereby control the temperature within the housing. A trap door 24 is provided for the aperture 44 which is moveable relative to the housing between a first position, in which the door does not cover the aperture, and a second position, in which the door substantially obstructs the aperture 44. Finally, a temperature sensitive material 40 is operatively associated with the trap door, wherein the temperature sensitive material, such as an adhesive, cord, filament or any other suitable material, including materials in a temperature responsive switch or sensor, is transformed upon exposure to sufficient heat or flame within the chassis so as to enable the trap door to move to the closed position relative to the aperture, thereby substantially preventing migration of any flame occurring within the chassis through aperture 14.

In a preferred embodiment the door is part of a replaceable shutter assembly, an example of which is shown as 50 in FIG. 8. The assembly 50 is insertable and removable relative to the chassis as indicated in FIGS. 12–15 whereby the shutter assembly may be inserted or removed from the chassis without interfering with ongoing operation of the chassis. Note in this regard the removal of the screw and insertion or removal of the assembly 50 has no impact whatsoever on the operation of the cards 34 and electronics contained therein. The assembly includes a mounting structure such as mounting plate 52 which is insertable into the housing into a fixed position relative to the housing, and a hinge 70 connecting the trap door 24 to the mounting plate 52.

As shown in FIG. 8, the temperature sensitive material may comprise an elongate, thin filament having a first end and a second end, with the first and second ends fixed to the mounting structure 52 and an intermediate portion extending between the first and second ends. The intermediate portion of the filament supports the trap door 24 against the mounting structure or plate 52 in an open position relative to said aperture (as shown in FIG. 13), but melts upon exposure to sufficient heat or flame within the housing to thereby release the trap door from the mounting structure 52 and thereby move with respect to the mounting structure to a substantially closed condition relative to the aperture 14, as shown in FIGS. 6 and 13.

As indicated in FIGS. 5 and 18, the chassis 10 may comprises a telecommunications device (such as a network access server, router, switch, span termination shelf, or similar device) containing a plurality of cards 34 arranged in a linear array of a predetermined length, and wherein the trap door has a length L (FIG. 9) greater than or equal to the length of the array of cards.

In still a further aspect of the invention, I have described a trap door for a chassis housing a plurality of electronic components, the chassis having an aperture for permitting warm air generated within the chassis to escape to thereby cool electronic components within the chassis. The door 24 has a substantially flat planar surface having a surface area sized to cover the aperture 44, as shown in the figures. A closure means such as a hinge, tracks, or another equivalent structure is provided that permits the door to move from an open position relative to the aperture to a closed position. A temperature sensitive material is operatively associated with the door to maintain said trap door in the open position during normal operation of the chassis. The temperature sensitive material cause the door to move via the closure means to the closed position when sufficient heat or flame are created within the chassis to thereby prevent flames from escaping.

It will be apparent to persons skilled in the art that many variations can be made from the illustrated embodiments without departure from the true spirit and scope of the invention. The particular design and construction of the trap door, temperature sensitive material, and other aspects of the invention will vary depending on space and other constraints, manufacturing and servicing requirements, and the type of chassis that the invention is practiced in. The spirit of the invention is intended to cover all such alternative implementations that may be derived from the instant disclosure. This true spirit and scope of the invention is to be determined by reference to the appended claims, interpreted in light of the foregoing specification.

What is claimed is:

1. A chassis for housing a plurality of electronic component with fire containment capability, comprising:
   a housing;
   at least one card insertable into and removable from said housing, said card containing at least one electronic component generating heat during operation of said chassis;
   an aperture for permitting warm air generated within said housing to escape into the environment to thereby control temperature within said housing;
   a trap door for said aperture moveable relative to said housing between a first position, in which said door does not cover said aperture, and a second position, in which said door substantially obstructs said aperture, and
   a temperature sensitive material comprising a filament operatively associated with said trap door, wherein said temperature sensitive material is transformed upon exposure to sufficient heat or flame within said chassis so as to enable said trap door to move to said second position relative to said aperture, thereby substantially preventing migration of any flame occurring within said chassis through said aperture; wherein said trap door is incorporated into a replaceable shutter assembly insertable and removable relative to said chassis whereby said shutter assembly may be inserted or removed from said chassis without interfering with ongoing operation of said chassis;
   wherein said shutter assembly comprises a mounting structure insertable into said housing into a fixed position relative to said housing, and a hinge connecting said trap door to said mounting plate; and
   wherein said temperature sensitive material comprises an elongate, thin filament having a first end and a second end, said first and second ends fixed to said mounting structure and an intermediate portion extending between said first and second ends, wherein said intermediate portion supports said trap door against said mounting structure in an open position relative to said aperture, but melts upon exposure to sufficient heat or flame within said housing to thereby release said trap door from said mounting structure and thereby move with respect to said mounting structure to a substantially closed condition relative to said aperture.

2. The chassis of claim 1, further comprising a grill covering said aperture.

3. The chassis of claim 2, wherein said grill is pivotable between a first, closed position and a second, open position.

4. The chassis of claim 1, wherein said chassis comprises a telecommunications device containing a plurality of cards arranged in a linear array of a predetermined length, and wherein said trap door has a length L substantially equal to or greater than said predetermined length.

5. A chassis for housing a plurality of electronic components with fire containment capability, comprising:
   a housing;
   at least one card insertable into and removable from said housing, said card containing at least one electronic component generating heat during operation of said chassis;
   an aperture for permitting warm air generated within said housing to escape into the environment to thereby control temperature within said housing;
   a trap door for said aperture moveable relative to said housing between a first position, in which said door does not cover said aperture, and a second position, in which said door substantially obstructs said aperture, and
   a temperature sensitive material operatively associated with said trap door, wherein said temperature sensitive material is transformed upon exposure to sufficient heat or flame within said chassis so as to enable said trap door to move to said second position relative to said aperture, thereby substantially preventing migration of any flame occurring within said chassis through said aperture;
   wherein said chassis comprises a telecommunications device containing a plurality of cards arranged in a linear array of a predetermined length, and wherein said trap door has a length L substantially equal to or greater than said predetermined length; and
   wherein said temperature sensitive material comprises an elongate filament extending underneath said trap door to thereby support said trap door in an open position, and wherein said filament, when exposed to sufficient heat or flame within said chassis, melts to thereby allow said trap door to move by gravity to a closed position relative to said aperture.

6. The chassis of claim 5, wherein said trap door has an lower surface and wherein said elongate filament is disposed adjacent to said lower surface to thereby support said trap door against the force of gravity in an open condition relative to said aperture.

7. The chassis of claim 4, wherein said array of cards defines a longitudinal direction of said chassis and wherein said aperture extends along said longitudinal direction of said chassis and is sized to be substantially equal to or greater in length as said predetermined length of said array of cards.

8. A chassis for housing a plurality of electronic components with fire containment capability, comprising:

a housing having side walls, a rear wall and a top surface;

a plurality of cards arranged in a array in said housing, said cards insertable into and removable from said housing, said cards containing at least one electronic component generating heat during operation of said chassis;

an elongate aperture in said rear wall for permitting warm air generated within said housing to escape into the environment to thereby control the temperature within said housing, said aperture extending across said rear wall in an upper region thereof above and behind said plurality of cards;

a grille extending across said upper region of said rear wall covering said aperture;

a trap door for said aperture moveable relative to said housing between a first position, in which said door does not cover said aperture, and a second position, in which said door substantially obstructs said aperture, and a temperature sensitive material operatively associated with said trap door, wherein said temperature sensitive material is transformed upon exposure to sufficient heat or flame within said housing so as to enable said trap door to move to said second position relative to said aperture, thereby substantially preventing circulation of air through said aperture and migration of any flame within said chassis through said aperture;

wherein said grille is adapted to pivot relative to said housing between a first position in which said grill substantially covers said aperture and a second position in which said grille does not substantially cover said aperture;

wherein trap door is incorporated into a replaceable shutter assembly insertable and removable relative to said chassis whereby said shutter assembly may be inserted or removed from said chassis without interfering with ongoing operation of said chassis;

wherein said shutter assembly comprises a mounting structure insertable into said housing into a fixed position relative to said housing, and a hinge connecting said trap door to said mounting plate;

wherein said temperature sensitive material comprises an elongate, thin filament having a first end and a second end fixed to said mounting structure and an intermediate portion extending between said first and second ends, wherein said intermediate portion supports said trap door against said mounting structure in an open position relative to said aperture, but melts upon exposure to sufficient heat or flame within said housing to thereby release said trap door from said mounting plate and thereby pivot with respect to said mounting structure to move to a substantially closed condition relative to said aperture.

9. The chassis of claim 8, wherein said temperature sensitive material comprises a filament having a first end operatively associated with said trap door and a second end fixed with respect to said housing, said filament maintaining said trap door in an open condition against the force of gravity and wherein said filament melts upon exposure to sufficient heat or flame within said housing to thereby enable said trap door to move to a substantially closed condition relative to said aperture.

10. A replacement fire containment shutter assembly for a chassis housing a plurality of electronic components, said shutter assembly insertable into said chassis and removable from said chassis, wherein said replacement shutter assembly comprises:

a mounting structure adapted for engaging said chassis;

a trap door moveable relative to said mounting structure; and a temperature sensitive material connecting said trap door to said mounting structure;

wherein said temperature sensitive material comprises a filament; and wherein said filament comprises an elongate polymeric filament.

11. The replacement shutter assembly of claim 10, wherein said filament comprises a first end and a second end and an intermediate portion, said first and second ends connected to said mounting structure and said intermediate portion supporting said trap door against said mounting structure against the force of gravity whereby, when said filament is exposed to sufficient heat or flame within said chassis, said filament melts to thereby release said trap door from said mounting structure.

12. A trap door for a chassis housing a plurality of electronic components, said chassis having an aperture for permitting warm air generated within said chassis to escape to thereby cool electronic components within said chassis, comprising:

a substantially flat planar surface having a surface area sized to cover said aperture;

a closure means for permitting said flat planar surface to move from an open position relative to said aperture to a closed position; and a temperature sensitive material operatively associated with said planar surface to maintain said trap door in said open position during normal operation of said chassis, said temperature sensitive material causing said planar surface to move via said closure means to said closed position when sufficient heat or flame are created within said chassis to thereby prevent flames from escaping from said chassis via said aperture;

wherein said trap door is incorporated into a replaceable fire containment shutter assembly insertable and removable relative to said chassis whereby said shutter assembly may be inserted or removed from said chassis without interfering with ongoing operation of said chassis;

wherein said shutter assembly comprises a mounting structure insertable into said housing into a fixed position relative to said housing, and wherein said temperature sensitive material connects said flat planar surface to said mounting structure;

wherein said temperature sensitive material comprises an elongate, thin filament having a first end and a second end fixed to said mounting structure and an intermediate portion extending between said first and second ends, wherein said intermediate portion supports said trap door against said mounting structure in an open position relative to said aperture, but melts upon exposure to sufficient heat or flame within said housing to thereby release said trap door from said mounting structure and thereby move with respect to said mounting structure to a substantially closed condition relative to said aperture.

13. The chassis of claim 8, wherein trap door is given a substantial planar surface having a side portion defining a length greater than or equal to a length defined by said cards installed in the chassis, and wherein said aperture extends along said rear surface of said housing in registry with said array of cards.

14. A chassis for housing a plurality of electronic components with fire containment capability, comprising:

a housing having side walls, a rear wall and a top surface;

a plurality of cards arranged in a array in said housing, said cards insertable into and removable from said housing, said cards containing at least one electronic component generating heat during operation of said chassis;

an elongate aperture in said rear wall for permitting warm air generated within said housing to escape into the environment to thereby control the temperature within said housing, said aperture extending across said rear wall in an upper region thereof above and behind said plurality of cards;

a grille extending across said upper region of said rear wall covering said aperture;

a trap door for said aperture moveable relative to said housing between a first position, in which said door does not cover said aperture, and a second position, in which said door substantially obstructs said aperture, and a temperature sensitive material operatively associated with said trap door, wherein said temperature sensitive material is transformed upon exposure to sufficient heat or flame within said housing so as to enable said trap door to move to said second position relative to said aperture, thereby substantially preventing circulation of air through said aperture and migration of any flame within said chassis through said aperture;

wherein trap door is given a substantial planar surface having a side portion defining a length greater than or equal to a length defined by said cards installed in the chassis, and wherein said aperture extends along said rear surface of said housing in registry with said array of cards;

wherein said temperature sensitive material comprises a filament extending along said side portion of said trap door to thereby support said trap door upwards above said cards against the force of gravity, whereby a fire in any of said cards, regardless of its location in said chassis, provides heat or flames proximate to said filament to thereby cause said trap door to be released to close said aperture before said flames migrate out of said chassis.

* * * * *